United States Patent
Cording et al.

(10) Patent No.: US 9,487,438 B2
(45) Date of Patent: Nov. 8, 2016

(54) INSULATING GLASS UNIT COMPRISING A SHEET OF GLASS WITH A FLUORINE DOPED TIN OXIDE COATING MADE FROM A GAS STREAM COMPRISING A NITRIC ACID SOLUTION AS OXIDIZING AGENT

(75) Inventors: Christopher R. Cording, Kingsport, TN (US); Eric Tixhon, Crisnée (BE); Alain Schutz, Jambes (BE)

(73) Assignees: AGC FLAT GLASS NORTH AMERICA, INC., Alpharetta, GA (US); AGC GLASS EUROPE, S.A, Gosselies (BE)

( * ) Notice: Subject to any disclaimer, the term of this patent is extended or adjusted under 35 U.S.C. 154(b) by 534 days.

(21) Appl. No.: 12/726,937

(22) Filed: Mar. 18, 2010

(65) Prior Publication Data
US 2010/0255225 A1 Oct. 7, 2010

Related U.S. Application Data

(60) Provisional application No. 61/161,186, filed on Mar. 18, 2009, provisional application No. 61/231,209, filed on Aug. 4, 2009.

(51) Int. Cl.
*C03C 17/34* (2006.01)

(52) U.S. Cl.
CPC ........... *C03C 17/3441* (2013.01); *C03C 17/34* (2013.01); *C03C 17/3417* (2013.01); *C03C 17/3452* (2013.01); *C03C 2218/322* (2013.01)

(58) Field of Classification Search
CPC .................. H01L 21/3165; B01K 2219/0281; C03C 17/2453
See application file for complete search history.

(56) References Cited

U.S. PATENT DOCUMENTS

| 4,146,657 | A | * | 3/1979 | Gordon ............... C03C 17/2453 136/256 |
| 4,580,439 | A | | 4/1986 | Manaka |
| 4,740,387 | A | | 4/1988 | Manaka |
| 5,897,957 | A | | 4/1999 | Goodman |
| 6,218,018 | B1 | | 4/2001 | McKown et al. |
| 6,492,528 | B1 | * | 12/2002 | Matsuba et al. ........... 548/316.4 |

(Continued)

FOREIGN PATENT DOCUMENTS

| CL | 40173 | 10/1995 |
| CL | 1589-98 | 7/1998 |

(Continued)

OTHER PUBLICATIONS

PCT International Search Report and Written Opinion, issued in PCT/US 10/27806 on May 10, 2010, 14 pages.

(Continued)

*Primary Examiner* — Francisco Tschen
(74) *Attorney, Agent, or Firm* — Rothwell, Figg, Ernst & Manbeck, P.C.

(57) ABSTRACT

The present invention provides low-E thin film optical stacks with improved optical and infrared reflecting properties and methods of making the same. More specifically, the present invention provides for a metal oxide thin film coating that exhibits lower emissivity values than its predecessor due to the inclusion of an oxidizer in the metal oxide deposition process, such as a strong acid such as nitric acid. The present invention also provides for a method that increases the coating efficiencies of the thin films described herein.

27 Claims, 4 Drawing Sheets

(56) References Cited

U.S. PATENT DOCUMENTS

| | | |
|---|---|---|
| 6,596,398 B1 * | 7/2003 | Russo et al. .................... 428/432 |
| 6,818,309 B1 * | 11/2004 | Talpaert et al. ............... 428/432 |
| 8,153,265 B2 | 4/2012 | Schutz et al. |
| 2004/0180218 A1 * | 9/2004 | Nagashima et al. .......... 428/432 |
| 2005/0130416 A1 | 6/2005 | Fujisawa et al. |
| 2005/0181619 A1 * | 8/2005 | Hwu et al. .................... 438/745 |
| 2006/0265979 A1 | 11/2006 | Cording |
| 2007/0264507 A1 | 11/2007 | Strickler et al. |
| 2007/0298190 A1 | 12/2007 | Kobori et al. |
| 2009/0011206 A1 | 1/2009 | Schutz et al. |
| 2009/0120496 A1 * | 5/2009 | Cording .............. C03C 17/3417 136/256 |

FOREIGN PATENT DOCUMENTS

| | | |
|---|---|---|
| CL | 45230 | 8/1999 |
| CL | 3281-08 | 11/2008 |
| CN | 101180243 A | 5/2008 |
| EP | 1 201 616 A2 | 5/2002 |
| JP | 59-184711 A | 10/1984 |
| JP | 3078230 U | 6/2001 |
| JP | 2008-539154 A | 11/2008 |
| WO | WO 2006117345 A1 * | 11/2006 |

OTHER PUBLICATIONS

Imamura, et al., "Band alignment of SiO2/Si structure formed with nitric acid vapor below 500 C" Surface Science vol. 603 (2009) pp. 968-972, doi:10.1016/j.susc.2009.01/026, Jan. 30, 2009.

Mizushima et al., "Nitric acid method for fabrication of gate oxides in TFT", Applied Surface Science vol. 254 (2008) pp. 3685-3689, 2007, doi:10.1016/j.apsusc.2007.10.103; Available online Nov. 13, 2007.

Chinese Office Action issued in CN 201080012781.6 on Sep. 26, 2013, including English language translation, 26 pages.

Japanese Office Action issued in JP 2012-500963 on Oct. 29, 2013, including English language translation, 8 pages.

Eurasian Office Action issued in EA 201101331 on Jul. 31, 2014, 6 pages.

Israeli Official Notification issued in IL 215159 on Aug. 19, 2014, 2 pages.

Japanese Office Action issued in JP 2012-500963 on Sep. 9, 2014, 3 pages.

Vietnamese Notice issued in VN 1-2011-02511 on Jan. 20, 2015, English language translation only, 2 pages.

Egyptian Official Decision issued in EG PCT 1548/2011 on Apr. 15, 2014, 4 pages.

Australian Examination Report issued in AU 2010226575 on Feb. 10, 2014, 3 pages.

Chilean first substantive report issued in CL 2011-2291 on Mar. 3, 2015, 8 pages.

Canadian Office Action issued in CA 2,755,003 on Jan. 7, 2016, 5 pages.

Chilean substantive report issued in CL 2011-2291 on Mar. 14, 2016, 7 pages.

Chinese Office Action issued in CN 201080012781.6 on Jun. 21, 2016, including English language translation, 24 pages.

Extended European Search Report issued in EP 10754105.4 on Sep. 1, 2016, 10 pages.

* cited by examiner

INSULATING GLASS UNIT COMPRISING A SHEET OF GLASS WITH A FLUORINE DOPED TIN OXIDE COATING MADE FROM A GAS STREAM COMPRISING A NITRIC ACID SOLUTION AS OXIDIZING AGENT

CROSS-REFERENCE TO RELATED APPLICATION

This application claims the benefit of U.S. Provisional Application Nos. 61/231,209, filed Aug. 4, 2009, and 61/161,186, filed Mar. 18, 2009, which are hereby incorporated by reference in their entirety into the present application.

JOINT RESEARCH AGREEMENT

The present disclosure was made by or on behalf of the below listed parties to a joint research agreement. The joint research agreement was in effect on or before the date the claimed invention was made and the claimed invention was made as a result of activities undertaken within the scope of the joint research agreement. The parties to the joint research agreement are AGC Flat Glass North America, Inc., Asahi Glass Co., Ltd., and AGC Glass Europe, S.A.

BACKGROUND OF THE INVENTION

1. Field of the Invention

The present invention relates generally to low emissivity ("low-E") coatings, and more particularly to low-E coatings incorporating at least one metal oxide layer as the infrared (IR) reflecting layer(s).

2. Discussion of the Background

All United States patents and patent applications referred to herein are hereby incorporated by reference in their entireties. In the case of conflict, the present specification, including definitions, will control.

Low emissivity (low-E) coatings on glass are designed to permit the passage of visible light while reflecting and blocking emission of infrared (IR) radiation. High visible transmittance, low emissivity coatings on architectural windows, automobiles and commercial refrigerator and freezer doors can lead to substantial savings in costs associated with environmental control, such as heating and cooling costs.

Generally speaking, coatings that provide for high visible transmittance and low emissivity are made up of a stack, which typically includes a transparent substrate and an optical coating. The stack may include one or more thin metallic layers, with high IR reflectance and low transmissivity, disposed between anti-reflective dielectric layers. The anti-reflective dielectric layers are generally transparent materials selected to enhance visible transmittance. These systems reflect radiant heat and provide insulation from the cold as well as from solar radiation. Most low-E stacks in use today are based on metal layers, such as silver, sandwiched between transparent metal oxide dielectric layers. In general, the thickness of the dielectric layers are tuned to reduce inside and outside reflectance so that the light transmittance is high (>60%). The IR reflective metallic layers may be virtually any reflective metal, such as silver, copper, or gold. Silver (Ag) is most frequently used for this type of application due to its relatively neutral color.

However, while coatings incorporating sputter deposited Ag layers in combination with dielectric layers in multilayer stacks can provide high performance solar control products (i.e., close to neutral in both reflection and transmission), there also can be significant disadvantages in using silver layers in such low-E optical stacks.

First, suitable silver layers are not susceptible to on-line deposition methods in which the coating is applied to a hot glass ribbon as it is produced, i.e., before it is cut and removed from the production line, but are applied by off-line low pressure techniques, such as magnetron sputtering. This limitation of sputter deposited silver layers increases the final coated product production time. Second, such coatings have limited chemical and mechanical durability, requiring careful protection and handling during processing and shipping. Thin, transparent metal layers of Ag are susceptible to corrosion when they are brought into contact, under moist or wet conditions, with various corrosive agents, such as atmosphere-carried chlorides, sulfides, sulfur dioxide and the like. To protect the Ag layers, various barrier layers can be deposited on the Ag. However, the protection provided by conventional barrier layers is frequently inadequate. Thin, transparent metal layers of Ag are also susceptible to degradation upon heat treatment, bending and/or tempering. When coated glass is tempered or bent, the coating is heated along with the glass to temperatures on the order of 600° C. and above for periods of time up to several minutes. These thermal treatments can cause the optical properties of Ag coatings to irreversibly deteriorate. This deterioration can result from oxidation of the Ag by oxygen diffusing across layers above and below the Ag. The deterioration can also result from reaction of the Ag with alkaline ions, such as sodium (Na+), migrating from the glass. The diffusion of the oxygen or alkaline ions can be facilitated and amplified by the deterioration or structural modification of the dielectric layers above and below the Ag. Coatings on glass must be able to withstand such elevated temperatures. However, previously known multilayer coatings employing Ag as an infrared reflective film frequently cannot withstand such temperatures without some level of deterioration of the Ag film.

Thus, there remains a need for low-E coating stacks (and methods of making them) that overcome the various aforementioned problems known to those of skill in the art. In particular, there is a need for low-E optical coatings which exhibit retained or increased aesthetic appeal, and mechanical and/or chemical durability, and which can be tempered or heat strengthened, if desired. It would be desirable to have a coating which would provide a high performance solar control glazing without the disadvantages of the silver coatings referred to above, and which preferably would have a near neutral color in reflection and transmission.

Thin film low-E infrared reflecting coating layers based on tin oxide, or doped tin oxide, represent such an alternative that circumvents the various aforementioned problems that can occur with sputter coated Ag infrared reflecting layers.

Low-E tin oxide thin film coatings are well known. Such tin oxide coatings offer several advantages over sputter coated Ag infrared reflecting layers. One such advantage is that the tin oxide coatings can be pyrolytically deposited onto a surface of a heated glass ribbon. In other words, the tin oxide thin film layer can be pyrolytically deposited online, which reduces the production time of the final desired coated product. Another such advantage is that the pyrolytically deposited tin oxide thin film layers are hardcoats. Hardcoats generally have a higher degree of mechanical and chemical durability when compared to softcoats such as offline sputter deposited Ag thin film layers. Such hardcoats, when incorporated into a low-E optical stack, impart an increased resistance to degradation upon heat treatment, tempering or bending. However, tin oxide based low-E thin film layers generally do not possess the IR reflecting properties approaching those of metal, or Ag, based low-E thin film layers. In addition, such a pyrolytic coating on glass is heat resistant and the glass can be heat-strengthened or tempered without damaging the coating.

Thus, there remains a need in the art for metal oxide based low-E thin film layers that can overcome the above-noted problems associated with sputter deposited metal, or Ag, thin film layers. In particular, there remains a need in the art for metal oxide based low-E thin film layers that possess infrared reflecting properties approaching those of sputter deposited metal, or Ag, thin film layers.

SUMMARY OF THE INVENTION

The present invention provides low-E thin film optical stacks having improved optical properties, as well as methods of making such improved low-E thin film optical stacks.

In an aspect of the present invention, there are provided methods of improving the optical and/or infrared reflecting properties of low-E thin film optical stacks.

In another aspect of the present invention, there are provided methods of improving the optical and/or infrared reflecting properties of low-E thin film optical stacks through introduction of an oxidizing chemical additive during pyrolytic deposition of a doped tin oxide thin film.

In another aspect of the present invention, the oxidizing chemical additive introduced during the pyrolytic deposition step can lead to a final coated product that, when incorporated into an insulating glass unit, IGU, imparts improved optical and/or infrared reflecting properties to the IGU.

In yet another aspect of the present invention, the oxidizing chemical additive introduced during the pyrolytic deposition step can lead to a coating efficiency increase of over 20%.

DETAILED DESCRIPTION OF THE INVENTION

While the present invention may be embodied in many different forms, a number of illustrative embodiments are described herein with the understanding that the present disclosure is to be considered as providing examples of the principles of the invention and such examples are not intended to limit the invention to preferred embodiments described and/or illustrated herein. The various embodiments are disclosed with sufficient detail to enable those skilled in the art to practice the invention. It is to be understood that other embodiments may be employed, and that structural and logical changes may be made without departing from the spirit or scope of the present invention.

The present invention provides low-E thin film optical stacks having improved optical and infrared reflecting properties and methods of making such low-E thin film optical coating stacks.

Figure 1:
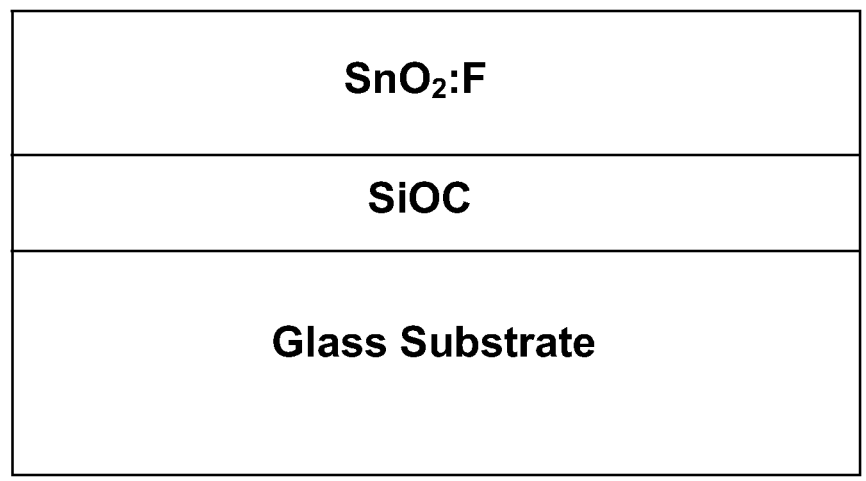
FIG. 1 shows the optical stack structure in accordance with an aspect of the present invention.

The methods in accordance with the present invention can provide low-E thin film optical stacks as described in FIG. 1. Such low-E optical stacks are of the general configuration: Glass substrate/SiOC/SnO2:F. The methods in accordance with the present invention are also applicable to low-E layers disposed on multiple undercoatings and/or nucleation layers, such as those described in FIG. 2. Such low-E optical stacks can be of the general configuration: Glass substrate/$TiO_2$/$SiO_2$/$SnO_2$:F. In this configuration, undercoatings deposited as $SiO_2$ may also comprise oxides of silicon that are substoichiometric in oxygen (denoted as "SiOx" or "SiOC") as well as those including a metal dopant such as Al and Sn. Such alternative multi-layered configurations will be recognized and appreciated by those of skill in the art.

As referred to herein, "E2+" or "Comfort E2+" represents the system: Glass Substrate(GS)/SiOC/$SnO_2$:F wherein the fluorine doped tin oxide thin film is deposited by pyrolytic chemical vapor deposition methods known to those of skill in this art in the presence of an oxidizing chemical additive. In this system, $HNO_3$ is the oxidizing chemical additive. Such systems can have a tin oxide thin film thickness in the range of 150 nm to 800 nm, and, more preferably, of about 430 nm.

The "undercoat layer," or "undercoating," or UC, may comprise a silicon oxycarbide layer of varying thicknesses, including the range of 400 angstroms to 1000 angstroms, and, more preferably, of approximately 720 angstroms. The UC provides the necessary index of refraction for color neutralization and thereby aids in improving the transmittance of the overall optical stack, and furthermore acts as a barrier to suppress sodium ion migration from the glass substrate to the low-E thin film.

"Float glass" or "flat glass" refers to glass produced on a float-line by floating a continuous stream of molten glass onto a bath of molten tin. The molten glass spreads onto the surface of the metal and produces a high quality, consistently level sheet of glass. The glass made by this method is the standard method for glass production. In fact, over 95% of the world production of flat glass is float glass. Unless otherwise specified, when referring to glass herein, it is meant that glass is produced by float-line methods.

"Online methods" or "online" is a term well-known and understood to those in the glass coating arts and, for purposes herein, refers to coating a glass ribbon during production of the glass on a float-line.

"Offline methods" or "offline" is also a term well-known and understood to those in the glass coating arts and, for purposes herein, refers to coating glass after the glass has been produced and removed from a float-line.

"Deposited onto" or "deposited on" as used herein means that the substance or layer is directly or indirectly applied above the referenced substance or layer. If applied indirectly, one or more substances or layers may intervene. Furthermore, unless otherwise indicated, in describing coatings of the present invention by use of the format "[substance or layer 1]/[substance or layer 2]/[substance or layer 3]/ . . . " or the format "a first [substance 1] layer; a first [substance 2] layer; a second [substance 1] layer; a second [substance 2] layer; . . . ", or the like, it is meant that each successive substance or layer is directly or indirectly deposited onto the preceding substance or layer.

"Haze" is defined herein in accordance with ASTM D 1003 which defines haze as that percentage of light which in passing through that deviates from the incident beam greater than 2.5 degrees on the average. "Haze" may be measured by methods known to those of skill in this art. Haze data presented herein were measured by a BYK Gardner haze meter (all haze values herein are measured by such a haze meter and are given as a percentage of the incident light that is scattered).

"Reflectance" is a term well understood in the art and is used herein according to its well known meaning. For example, the term "reflectance" as used herein means the amount of visible, infrared and ultraviolet light that is reflected by a surface relative to the amount that strikes it.

"Absorptance" is a term well understood in the art and is used herein according to its well known meaning. Absorptance is the ratio of solar energy striking the absorber that is absorbed by the absorber to that of solar energy striking a blackbody (perfect absorber) at the same temperature.

The terms "heat treatment", "heat treated" and "heat treating" as used herein mean heating the article to a temperature sufficient to enable thermal tempering, bending, or heat strengthening of the coated glass inclusive article. This definition includes, for example, heating a coated article to a temperature of at least about 1100° F. (e.g., to a temperature of from about 550° C. to 700° C.) for a sufficient period to enable tempering, heat strengthening, or bending.

The term "Solar Heat Gain Coefficient" or "SHGC" or "G" is well known in the art and refers to a measure of the total solar heat gain through a window system relative to the incident solar radiation. It is a measure of how well a window blocks heat from sunlight and represents a fraction of the heat from the sun that enters through a window. SHGC is expressed as a number between 0 and 1. The lower a window's SHGC, the less solar heat it transmits.

"Emissivity" (or emittance) (E) is a measure, or characteristic of reflectance of light at given wavelengths and is represented by the formula: $E=1-Reflectance_{film}$ for infrared long wavelengths. Emissivity is the ratio of radiation emitted by a black body or a surface and the theoretical radiation predicted by Planck's law. The term emissivity is used to refer to emissivity values measured in the infrared range by the American Society for Testing and Materials (ASTM) standards. Emissivity can be measured using radiometric measurements and is reported as hemispherical emissivity and normal emissivity. The emissivity indicates the percentage of long infrared wavelength radiation emitted by the coating. A lower emissivity indicates that less heat will be transmitted through the glass. The actual accumulation of data for measurement of such emissivity values is conventional and known to those of skill in this art and may be done by using, for example, a Beckman Model 4260 spectrophotometer with "VW" attachment (Beckman Scientific Inst. Corp.). This spectrophotometer measures reflectance versus wavelength and from this, emissivity can be calculated using standard equations known to those of skill in this art.

"U Value" or "U Factor" or "Coefficient of Heat Transmission" as referred to herein, represents a measure of the rate of non-solar heat loss or gain through a material or assembly. U values gauge how well a material allows heat to pass through. U value ratings generally fall between 0.20 Btu/hr-sq ft-° F. and 1.20 Btu/hr-sq ft-° F. The lower the U value, the greater a product's resistance to heat flow and the better its insulating value. The inverse of (one divided by) the U-value is the R value. U value is expressed in units of $W/m^2$-° C. or Btu/hr-sq ft-° F. In the US, values are normally given for NFRC/ASHRAE winter conditions of 0° F. (−18° C.) outdoor temperature, 70° F. (21° C.) indoor temperature, 15 mph wind, and no solar load. U values are often quoted for windows and doors. In the case of a window, for example, the U value may be expressed for the glass alone or the entire window, which includes the effect of the frame and the spacer materials.

"Low-E" or "Low-E Coating" as referred to herein is a microscopically thin, virtually invisible metal or metallic oxide layer(s) deposited on a glass surface to reduce the emissivity by suppressing radiative heat-flow through the glass.

"Hardcoat" or "Hardcoating" as referred to herein with respect to low-E thin film coatings, means a pyrolytically deposited coating that has been sprayed or applied onto a glass surface at high temperatures during the float glass process.

"Softcoat" or "Softcoating" as referred to herein with respect to low-E thin film coatings, means a vacuum sputtered coating that has been applied in multiple layers of optically transparent metal sandwiched between layers of dielectrics (usually metal oxides).

"Transmittance" is a term well understood in the art and is used herein according to its well known meaning. The term transmittance herein is made up of visible, infrared and ultraviolet energy transmittance.

"Sheet resistance" ($R_s$) is a well known term in the art and is used herein in accordance with its well known meaning. It is reported herein in ohms per square units. Generally speaking, this term refers to the resistance in ohms across any square of a layer system on a glass substrate to an electric current passed through the layer system. Sheet resistance is an indication of how well the layer or layer system is reflecting infrared energy, and is thus often used along with emissivity as a measure of this characteristic. "Sheet resistance" may for example be conveniently measured by using a 4-point probe ohmmeter, such as a dispensable 4-point resistivity probe with a Magnetron Instruments Corp. head, Model M-800 produced by Signatone Corp. of Santa Clara, Calif.

"Insulating Glass Unit" or "IGU" is a term well known to those of skill in the art. An IGU typically is comprised of two or three sheets of glass sealed at their peripheral edges by a sealant assembly, generally referred to as an edge seal. In an IGU comprised of three sheets of glass, two insulating chambers are formed between the three sheets of glass. In an IGU comprised of two sheets of glass, a single insulating chamber is formed. The number of glass sheets contained in an IGU will depend on the intended use of the IGU. For example, IGUs to be utilized for refrigerators are typically constructed of two sheets of glass, while IGUs for freezers typically utilize three sheets of glass. Before final sealing, the chambers can be filled with air or an inert gas such as argon, krypton, or other suitable gas to improve the thermal performance of the IGU.

"Coating Efficiency" as referred to herein is defined as the actual thickness of a $SnO_2$:F layer divided by the theoretical thickness of the same $SnO_2$:F layer, assuming 100% of the starting materials are converted into the final thin film being deposited. The theoretical thickness can be calculated based on the amount of tin starting material being delivered to a surface of a glass substrate, the flow rate of the tin starting material, the surface area of the glass ribbon being coated and the speed of glass ribbon as it passes under a coater delivering the tin oxide starting materials. Such methods of calculating theoretical thicknesses are known to those of skill in the art.

The following description provides a general method of providing an undercoating and a metal oxide thin film, such as fluorine doped tin oxide, of the present invention. The following description is intended to be non-limiting and modifications and variations of the generally described method can be adapted and changed for a desired final product by those of ordinary skill in the thin film coating arts, such changes still falling within the scope of the present invention.

Soda-lime silicate float, or flat, glass made from well-known glass batch compositions can be melted by heating in a glass melting furnace. The temperatures required for such glass batch melting is typically from about 1500° C. to 1600° C. After melting to create a molten glass, the molten glass is poured into a float bath of molten tin, from which the glass is floated out to form a glass ribbon. The glass ribbon typically has a temperature of about 600° C. to 1100° C. in the float bath of molten tin. The glass ribbon cools as it is moved away from the glass melting furnace. In the area on the float-line where the undercoating and fluorine doped tin oxide thin films of the present invention are pyrolytically deposited, the temperature of the glass ribbon is typically about 500° C. to 800° C.

From a first coater positioned in a float bath, the undercoating of the present invention can be pyrolytically deposited. A mixed gas stream containing silane ($SiH_4$), carbon dioxide ($CO_2$), ethylene ($C_2H_4$) and nitrogen (carrier gas) can be directed to a heated surface of the glass ribbon for creation and deposition of a silicon oxycarbide thin film undercoating. The gases of the mixed gas stream can be included in each of the aforementioned starting materials can be supplied at the following rate ranges: 1) silane ($SiH_4$) 2.0-40.0 g/min; 2) carbon dioxide ($CO_2$) 50.0-500.0 g/min; 3) ethylene ($C_2H_4$) 0.0-150.0 g/min; and 4) nitrogen (carrier gas) 0.0-200.0 g/min. Preferred ranges for the delivery of starting materials are: 1) silane ($SiH_4$) 15.0-25.0 g/min; 2) carbon dioxide ($CO_2$) 150.0-200.0 g/min; 3) ethylene ($C_2H_4$) 20.0-100.0 g/min; and 4) nitrogen (carrier gas) 30.0-60.0 g/min. If a double undercoating $TiO_2$—$SiO_2$ is to be used, a pre-coater can be positioned in the float bath as well, before the first coater that deposits the Si based layer. From the pre-coater, a mixed gas stream containing titanium tetra-isopropoxide: $Ti[-O-CH-(CH_3)_2]_4$ (abbreviated as "TTIP") and nitrogen (carrier gas) can be directed to a surface of the substrate for creation and deposition of a titanium oxide thin film undercoating. Those of skill in the art will recognize and appreciate that the positioning of the coaters can be varied. Non-limiting examples include positioning both undercoating coaters in the float bath, as described above, or positioning one undercoating coater in the float bath and the other undercoating coater downstream of the one undercoating coater in the float bath. Also, both undercoating coaters can be positioned downstream from the float bath.

From a second coater positioned downstream from a first coater, the fluorine doped tin oxide thin film of the present invention can be pyrolytically deposited. A mixed gas stream containing monobutyl tin trichloride ($C_4H_9SnCl_3$), trifluoroacetic acid ($CF_3CO_2H$), air, steam, oxygen and nitric acid ($HNO_3$-oxidizing chemical additive) can be directed to a surface of the undercoating for creation and deposition of a fluorine doped tin oxide thin film. As will be recognized by those of ordinary skill in the art, it will sometimes be necessary to employ a solvent to aid in keeping the tin containing starting material in solution to help control volatility of the tin containing starting material as well as to prevent the starting materials of the gas mixture from reacting with each other. Well known solvents for accomplishing this are lower ($C_1$-$C_5$) dialkyl ketones, such as acetone, diethyl ketone, methyl isobutyl ketone and methyl ethyl ketone. A preferred lower dialkyl ketone of the present invention is methyl isobutyl ketone. In the case where the gases are delivered individually, or separately, to a heated surface, such solvents are not necessary, but can be employed, if desired.

The gases of the mixed gas stream can be included in each of the aforementioned starting materials supplied at the following rates: 1) 0.20-2.00 kg/min of a mixture containing 70%-95% of monobutyl tin trichloride, 5%-20% trifluoroacetic acid and 0%-15% methyl isobutyl ketone; 2) 0.00-5.00 kg/min of water vapor; 3) 0.00-2.00 kg/min of air; and 4) 0.10-2.50 kg/min of an aqueous solution of 10%-100% nitric acid Preferred ranges for the delivery of starting materials are: 1) 0.20-2.00 kg/min of a mixture containing 80%-95% of monobutyl tin trichloride, 5%-15% trifluoroacetic acid and 0%-15% methyl isobutyl ketone; 2) 0.00-2.5 kg/min of water vapor; 3) 0.00-2.00 kg/min of air; and 4) 0.30-2.20 kg/min of an aqueous solution of 20%-100% nitric acid.

Alternatively, the fluorine doped tin oxide thin film of the present invention can as well be pyrolytically deposited from the following precursors. A mixed gas stream containing monobutyl tin trichloride ($C_4H_9SnCl_3$ or "MBTC"), air, steam, hydrofluoric acid (HF) and nitric acid ($HNO_3$) can be directed to a surface of the undercoating for creation and deposition of a fluorine doped tin oxide film. In this alternative, no further solvent is required. The gases of the alternative gas stream can be supplied at the following rates: 1) 20-170 kg/h of MBTC; 2) 100-2000 kg/h of air; 3) 0-30 kg/h of $H_2O$; 4) 10-50 kg/h of HF (water solution of 2.5 weight %); and up to 30 kg/h of $HNO_3$ (water solution of 70 wt. %).

The introduction of an oxidizing chemical other than water, air or oxygen, can be carried out by methods known to those of skill in the art. A non-limiting example of introducing the oxidizing chemical is mixing the vapor of the oxidizing chemical with the pyrolytic vapor prior to exposure to a fluorine doped tin oxide coater. Another non-limiting example of introduction of the oxidizing chemical is applying the oxidizing chemical vapor in front of a fluorine doped tin oxide coater.

The inventors of the subject matter disclosed herein have surprisingly found that using oxidizing chemical additives, other than the traditional water, air or oxygen, while pyrolytically depositing a $SnO_2$:F low-E thin film on glass can lead to increased optical and infrared reflecting properties of the low-E thin film. Thus, a low-E optical coating system with such properties is desirable for incorporation into single- and multi-pane glass products. A non-limiting example of a multi-pane glass product may be an insulated glass unit (IGU) module, such as those shown in FIGS. 3 and 4.

Figure 3:
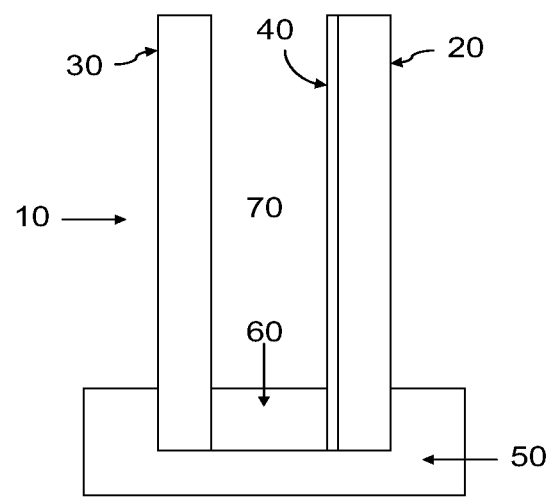
FIG. 3 shows an insulated glass unit including the optical stack structure of FIG. 1.

Shown in FIG. 3 is a two pane IGU assembly comprising the coating of FIG. 1. The IGU assembly 10 includes an outer glass sheet 20 and inner glass sheet 30 separated by a chamber 70, a frame 50, and a sealant assembly 60. The coating 40 of FIG. 1 is disposed on an inner surface of outer glass sheet 20. The coating 40 may also be disposed on an inner surface of inner glass sheet 30 (instead of outer glass sheet 20), if desired. The low-E coating of the present invention may be disposed on either inner-facing surface of outer glass sheet 20 or inner glass sheet 30.

Figure 2:
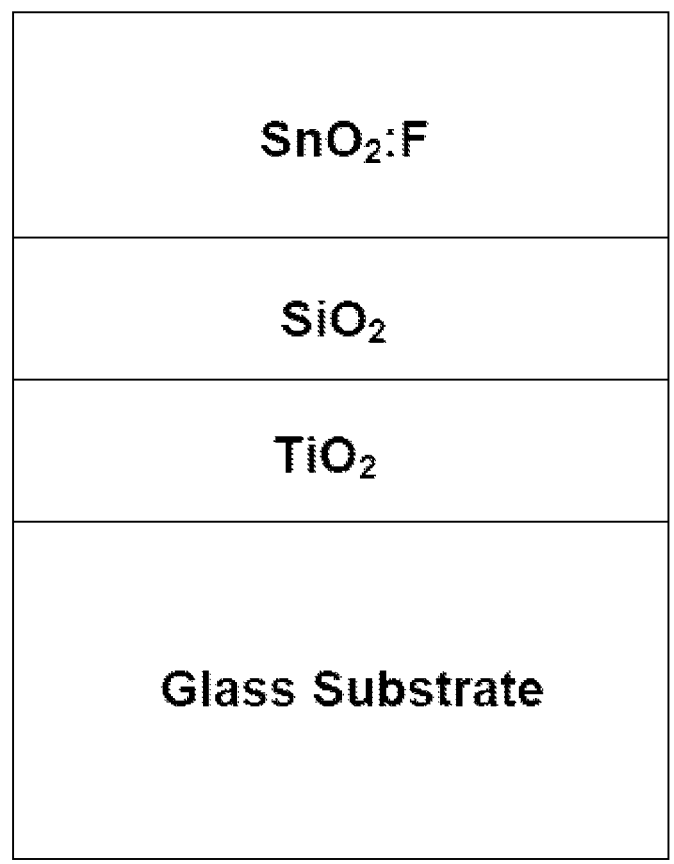
FIG. 2 shows the optical stack structure in accordance with another aspect of the present invention.
Figure 4:
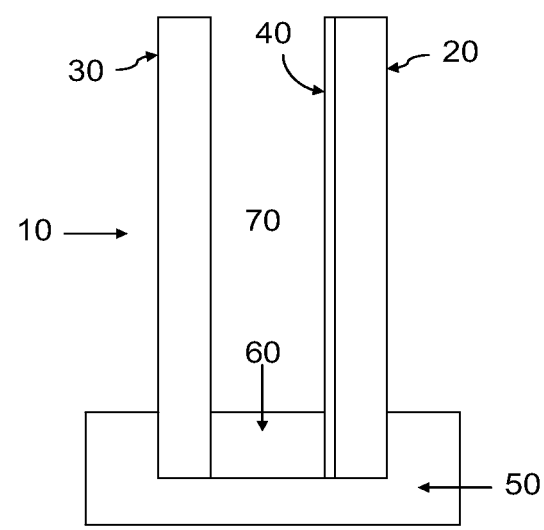
FIG. 4 shows an insulated glass unit including the optical stack structure of FIG. 2.

Shown in FIG. 4 is a two pane IGU assembly comprising the coating of FIG. 2. The IGU assembly 10 includes an outer glass sheet 20 and inner glass sheet 30 separated by a chamber 70, a frame 50, and a sealant assembly 60. The coating 40 of FIG. 2 is disposed on an inner surface of outer glass sheet 20. The coating 40 may also be disposed on an inner surface of inner glass sheet 30 (instead of outer glass sheet 20), if desired.

The inventors have found that addition of an oxidizing chemical additive, other than the traditional water, air or oxygen, to the pyrolytic vapor deposition process when producing online deposited metal oxide low-E thin films on glass results in an increase in the infrared reflecting properties of the metal oxide thin film. Methods disclosed herein for online deposition of metal oxide thin films on glass are also applicable to offline produced metal oxide thin films on glass. Such adaptations to offline methods will be recognized by those of skill in the art.

Non-limiting examples of suitable oxidizing chemical additives may be oxygen, ozone, hydrogen peroxide and other peroxides, nitric acid, ammonium nitrate and other nitrates, nitrites, nitrous oxide, sulfuric acid, sulfates and per-sulfates, hypochloric acid, chlorates, per-chlorates, bromates and borates.

In a further aspect of the present invention, a metal oxide thin film production method that allows for improvement in the optical and infrared reflecting properties of the deposited metal oxide thin film is provided.

For the metal oxide thin film of the present invention, it is preferable to dispose an undercoating below the metal oxide thin film such that the undercoating is positioned between the substrate and the metal oxide thin film. An undercoating can serve numerous purposes. The undercoating can serve to prevent an alkaline component contained in a substrate, i.e., glass, from thermally diffusing into a thin film disposed above the undercoating. Also, an undercoating can serve to strengthen the bond of the substrate to a thin film at such sufficient strengths that the characteristics of the thin film do not easily degrade. Furthermore, an undercoating can also serve to provide a desired index of refraction, acting as a color suppression layer such that interference colors originating from a thin film or a substrate can be reduced.

The undercoating of the present invention may be a single thin film layer configuration or have a multi-layered configuration. The materials utilized for the undercoating of the present invention are well-known to those of ordinary skill in the art. Non limiting examples of these materials are oxides, nitrides, carbides, oxynitrides and oxycarbides of titanium, silicon, tin, zinc, zirconium, chromium, aluminum, indium, manganese, vanadium and combinations thereof.

For the undercoating of the present invention, it is preferred to use a single thin film layer that comprises silicon. More preferably, the undercoating uses a thin film material that comprises silicon and oxygen. Preferred undercoatings can be, but are not limited to, silicon oxide, silicon dioxide, silicon nitride, silicon oxynitride, silicon carbide, silicon oxycarbide and combinations thereof. An undercoating of the present invention illustrated herein is a silicon oxycarbide thin film.

Vapor deposition of silicon oxycarbide layers is well-known in the thin film coating arts. A silicon oxycarbide undercoating utilized in the present invention can be pyrolytically vapor deposited from starting materials such as silane ($SiH_4$), carbon dioxide ($CO_2$), ethylene ($C_2H_4$) and nitrogen (carrier gas) at elevated temperatures, preferably in the range of 400° C.-800° C. Most preferably, the elevated glass substrate temperatures are in the range 650° C.-750° C.

The thickness of the undercoating of the present invention is not particularly limited. A preferred thickness is a thickness in the range of 400 Å to 1000 Å thick. More preferably, the thickness of the undercoating is 600 Å to 900 Å. Most preferably, the thickness of the undercoating thin film is 700 Å to 800 Å. Silicon oxycarbide undercoatings of the present invention in the thickness ranges above can lead to color suppression of the color originating from tin oxide iridescence.

Other silicon containing starting materials are also usable within the scope of the present invention. Other well-known silicon containing starting materials include, but are not limited to, disilane, trisilane, monochlorosilane, dichlorosilane, 1,2-dimethylsilane, 1,1,2-trimethyldisilane and 1,1,2,2-tetramethyldisilane. When using silanes as starting materials, it is common to include oxidizing materials in the gaseous stream. The oxidizing materials can be carbon dioxide, carbon monoxide and nitrogen dioxide. When silane is used as a starting material, an unsaturated hydrocarbon gas, such as ethylene, acetylene, or toluene, may be added to the gaseous stream to prevent the silane starting material from reacting before reaching the substrate surface.

When using an additional Ti based undercoating in accordance with the present invention, titanium containing starting materials that can be used include, but are not limited to, halides, such as $TiCl_4$, alkoxides such as titanium tetraethoxide, titanium tetra-isopropoxide and titanium tetra-butoxide and β-diketones such as titanium (diisopropoxy) bisacetylacetonate. Titanium tetra-isopro-poxide ($Ti[-O-CH-(CH_3)_2]_4$, or "TTIP") is highly volatile and is generally preferred.

The fluorine doped tin oxide film of the present invention can be made by pyrolytic deposition methods known to those of ordinary skill in the thin film arts. This process can employ a number of well-known starting materials and precursors to arrive at the final thin film low-E metal oxide product.

Tin precursors for thin film coatings made by pyrolytic deposition processes of the present invention are conventional and well-known in the art. An especially suitable tin precursor is monobutyltin-trichloride. This substance is well-known and readily available, and is commonly used as a tin precursor for deposition of tin containing thin film coatings on flat glass. Other tin precursors are also usable within the scope of the present invention. Other well-known tin precursors include, but are not limited to, dimethyltin dichloride, dibutyltin dichloride, tetramethyltin, tetrabutyltin, dioctyltin dichloride, dibutyltin diacetate and tin tetrachloride.

Fluorine doping of tin oxide thin films is also well-known to those of ordinary skill in the thin film coating arts. To accomplish this, a fluorine containing starting material may be added to the gas stream with the tin containing starting material. Non-limiting examples of the fluorine containing starting materials include fluorine gas, hydrogen fluoride, nitrogen trifluoride, trifluoroacetic acid, bromo-trifluoromethane, difluoroethane and chlorodifluoromethane.

A fluorine doped tin oxide thin film coating of the present invention may be pyrolytically vapor deposited from such starting materials as monobutyl tin trichloride ($C_4H_9SnCl_3$), trifluoroacetic acid ($CF_3CO_2H$), air, steam and an additional oxidizing chemical additive other than water, air or oxygen at elevated temperatures. Preferably, the elevated temperatures for the pyrolytically vapor deposition step are in the range of 400° C.-800° C. Most preferably, the elevated temperatures are in the range 550° C.-750° C.

The thickness of the fluorine doped tin oxide thin film coating of the present invention is preferably 100 nm to 1000 nm thick. More preferably, the thickness of the fluorine doped tin oxide thin film coating is 200 nm to 800 nm. Most preferably, the thickness of the fluorine doped tin oxide thin film coating is 200 nm to 600 nm.

EXAMPLE 1

From a first coater positioned inside a float bath, a mixed gas stream containing silane ($SiH_4$), carbon dioxide ($CO_2$), ethylene ($C_2H_4$) and nitrogen ($N_2$—carrier gas) was directed to a heated surface of the glass ribbon. The gases of the mixed gas stream included the starting materials supplied at the following rate ranges: 1) silane ($SiH_4$) 13.5 gm/min; 2) carbon dioxide ($CO_2$) 100.0 gm/min; 3) ethylene ($C_2H_4$) 50.0 gm/min; and 4) nitrogen (carrier gas) 40.0 gm/min.

From a second coater positioned downstream from a first coater, a mixed gas stream containing monobutyl tin trichloride ($C_4H_9SnCl_3$), trifluoroacetic acid ($CF_3CO_2H$), air, steam and nitric acid ($HNO_3$—oxidizing chemical additive) was directed to a surface of the undercoating. The gases of the mixed gas stream included the starting materials supplied at the following rate ranges: 1) 0.98 kg/min of a mixture containing 93% monobutyl tin trichloride, 5% trifluoroacetic acid and 2% methyl isobutyl ketone; 2) 0.85 kg/min of water vapor; 3) 0.88 kg/min of air; and 4) 0.78 kg/min of an aqueous solution of 67.2% nitric acid.

EXAMPLE 2

From a first coater positioned inside a float bath, a mixed gas stream containing silane ($SiH_4$), carbon dioxide ($CO_2$), ethylene ($C_2H_4$) and nitrogen ($N_2$—carrier gas) was directed to a heated surface of the glass ribbon. The gases of the mixed gas stream included the starting materials supplied at the following rate ranges: 1) silane ($SiH_4$) 13.5 gm/min; 2) carbon dioxide ($CO_2$) 100.0 gm/min; 3) ethylene ($C_2H_4$) 50.0 gm/min; and 4) nitrogen (carrier gas) 40.0 gm/min.

From a second coater positioned downstream from a first coater, a mixed gas stream containing monobutyl tin trichloride ($C_4H_9SnCl_3$), trifluoroacetic acid ($CF_3CO_2H$), air, steam and nitric acid ($HNO_3$—oxidizing chemical additive) was directed to a surface of the undercoating. The gases of the mixed gas stream included the starting materials supplied at the following rate ranges: 1) 0.81 kg/min of a mixture containing 81% monobutyltin trichloride, 15% trifluoroacetic acid and 4% methyl isobutyl ketone; 2) 0.80 kg/min of water vapor; 3) 1.62 kg/min of air; and 4) 0.34 kg/min of an aqueous solution of 67.2% nitric acid.

The fluorine doped tin oxide thin films made by methods of the present invention produce thin films that demonstrate increased optical and infrared reflecting properties when compared to fluorine doped tin oxide thin films that are pyrolytically deposited in the absence of an oxidizing chemical additive, such as nitric acid. The optical and infrared reflecting properties of fluorine doped tin oxides made in accordance with methods of the present invention are discussed below. It should be noted that the representative inventive methods described above provide exemplary methods of making the inventive samples discussed below.

Table 1 lists optical and infrared reflecting properties for inventive sample E2+ as compared to reference sample E2. Both samples were deposited on float glass having a thickness of 3.2 mm.

TABLE 1

Optical and Infrared Reflecting Properties of E2+ and E2 Low-E Coatings on Single Panes of 3.2 mm Thick Glass.

| Sample | Emissivity | $R_s$ ($\Omega * m$) | Haze (%) | $SnO_2$:F Thickness (nm) |
|---|---|---|---|---|
| E2+ | 0.12 | 11.2 | 0.37% | 430 |
| E2 | 0.21 | 21.0 | 0.37% | 280 |

For the data listed in Table 1, it is noted that the fluorine doped tin oxide thin film coatings deposited for both inventive sample E2+ and reference sample E2 were deposited with substantially the same starting materials and deposition conditions, with the only material difference being the addition of an oxidizing chemical additive, nitric acid in this case, to the mixed gas stream of starting materials for inventive sample E2+.

A lower emissivity by a value of 0.09 is observed for inventive sample E2+ when compared to reference sample E2. The emissivities of both samples were measured with an emissometer, an apparatus well known to those of ordinary skill in the art. The addition of an oxidizing chemical additive, such as nitric acid, to the mixed gas stream of $SnO_2$:F thin film starting materials for inventive sample E2+ can have an unexpectedly marked effect on the emissivity of the thin film coating. A lower sheet resistance ($R_s$) of about 10.0 is also observed for inventive sample E2+ when compared to reference sample E2. The sheet resistivities for both samples were measured with a 4-point probe sheet resistance meter, an apparatus well known to those of skill in the art. For architectural and aesthetic purposes, the sheet resistance is an indication of how well the layer or layer system is reflecting infrared energy, and is thus often used along with emissivity as a measure of this characteristic. Thus, both emissivity and sheet resistance values are unexpected lower for inventive sample E2+ than for reference sample E2, indicating that inclusion of an oxidizing chemical additive such as nitric acid to the mixed gas stream during deposition of SnO2:F thin films leads to a thin film coating that has surprisingly improved infrared reflecting properties, i.e., the E2+ thin film coating.

Also observed are substantially the same haze values for both inventive sample E2+ and reference sample E2. This indicates that the addition of the oxidizing chemical additive to the mixed gas stream of $SnO_2$:F starting materials for E2+ has substantially no effect on the final coating's ability to scatter light. Also observed is a vast difference in $SnO_2$:F thin film thickness. For inventive sample E2+, a thin film thickness of 430 nm is observed. For reference sample E2, a thin film thickness of 280 nm is observed. As was stated above, the $SnO_2$:F thin film coating deposited for both inventive sample E2+ and reference sample E2 were deposited with substantially the same starting materials, amounts thereof and deposition conditions, with the only material difference being the addition of an oxidizing chemical additive, nitric acid in this case, to the mixed gas stream of starting materials for inventive sample E2+. As can be seen, the thickness of the $SnO_2$:F thin film for E2+(430 nm) is much greater than that of the $SnO_2$:F thin film for E2 (280 nm). Therefore, and unexpectedly, the utilization of an oxidizing chemical additive, such as nitric acid, can lead to vast coating efficiency gains with respect to $SnO_2$:F thin film deposition. The thin film thickness data listed in Table 1 represents a thin film thickness gain of about 150 nm. This translates to a thin film coating efficiency gain of over 50% (about 55%). In other words, with the methods used in making inventive sample E2+, about 55% more $SnO_2$:F thin film thickness can be realized with the addition of nitric acid to the starting material mixed gas stream. This coating efficiency increase is realized without the need to increase the amount of starting materials used and provides the advantage of decreased manufacturing costs for producing the thin film coatings of the present invention.

Table 2 lists optical and infrared reflecting properties for IGUs incorporating inventive samples E2+ and reference samples E2. For comparison, data for IGUs incorporating thin films "Energy Advantage" and "Comfort Ti-PS" are included as well. Comfort Ti-PS glass is manufactured by AGC Flat Glass North America, Inc., of Alpharetta, Ga., which is a low-E coated glass. For the Ti-PS system, Ag is utilized as the infrared reflecting layers. Energy Advantage (EA) glass is manufactured by Pilkington, Inc., of Merseyside, England, which is a low-E coated glass. For the EA system, $SnO_2$:F is utilized for the infrared reflecting layers.

TABLE 2

Optical and Infrared Reflecting Properties of E2+ and E2, EA and Ti-PS Low-E Coatings Incorporated Into Insulating Glass Units.

| | Sample | | | |
|---|---|---|---|---|
| | E2+ | E2 | EA | Ti-PS |
| Emissivity | 0.149 | 0.204 | 0.156 | 0.06 |
| U Value (BTU/hr-ft$^2$-° F.) 3.2 mm/12 mm/3.2 mm 3$^{rd}$ surface, Air | 0.332 | 0.348 | 0.334 | 0.303 |
| U Value (BTU/hr-ft$^2$-° F.) 3.2 mm/12 mm/3.2 mm 3$^{rd}$ surface, Argon | 0.285 | 0.305 | 0.288 | 0.252 |
| Solar Heat Gain Coefficient | 0.726 | 0.730 | 0.728 | 0.614 |
| T-vis (%) | 73.7 | 75.6 | 75.2 | 77.6 |

The data contained in Table 2 is representative of the inventive, reference and comparative low-E thin film coatings on glass incorporated into an IGU comprised of two panes of glass, each having a thickness of 3.2 mm and being spaced apart by 12 mm. The gas contained between the two panes is either air or argon and is indicated in the table. Also, the inventive and reference low-E coating described herein are located on the third glass surface from which ambient light is incident.

Lower U values are observed for inventive thin films E2+ as compared to reference thin films E2 when incorporated into IGUs possessing either air or argon between the two glass panes. When air is the gas between the two glass panes, a difference in U values of 0.016, or 4.6%, is realized between IGUs incorporating E2+ and E2. When argon is the gas between the two glass panes, a difference in U values of 0.020, or 6.6%, is realized between IGUs incorporating E2+ and E2. Lower Solar Heat Gain Coefficient (SHGC) values and T-vis values are also observed for inventive thin films E2+ as compared to reference thin films E2 when incorporated into IGUs possessing either air or argon between the two glass panes. Of the three products listed in Table 2 that are pyrolytically deposited $SnO_2$:F thin films, inventive sample E2+ is observed to have a lower emissivity, a lower U value, a lower SHGC and a lower visible transmittance than reference sample E2 and comparative sample EA. Ti-PS, which is a Ag based low-E coated glass, displays better infrared reflecting properties (emissivity, U value, SHGC) than E2+. Furthermore, Ti-PS also has better infrared reflecting properties than E2 and EA.

Hence, the addition of an oxidizing chemical additive such as nitric acid to the mixed gas stream during deposition of $SnO_2$:F thin films of the present invention provides for an increase in infrared reflecting properties of at least 4% when such inventive $SnO_2$:F thin films are incorporated into insulating glass units comprising two panes of glass. Such increases in infrared reflecting properties allows for low-E coatings based on $SnO_2$:F to be competitive with conventional low-E thin film coatings based on Ag from a performance standpoint. Moreover, the inventive thin films, and methods of making, allow for dramatic coating efficiency gains with respect to $SnO_2$:F pyrolytic deposition. Such increases in coating efficiency allows for low-E coatings based on $SnO_2$:F to be competitive with conventional low-E thin film coatings based on Ag from a cost standpoint as well.

It is well known in the thin film coating arts that better coating efficiency leads to thicker deposited thin film layers. Thicker deposited thin film layers, in turn, lead to lower thin film emissity values. Hence, the coating efficiency gained by the inclusion of an oxidizing chemical additive such as nitric acid can also allow for increases in infrared reflection properties.

EXAMPLE 3

From a first coater positioned inside a float bath, a mixed gas stream containing silane ($SiH_4$), carbon dioxide ($CO_2$), ethylene ($C_2H_4$) and nitrogen ($N_2$—carrier gas) was directed to a heated surface of the glass ribbon. The gases of the mixed gas stream included the starting materials supplied at the following rate ranges: 1) silane ($SiH_4$) 1.2 kg/h; 2) carbon dioxide ($CO_2$) 14 kg/h; 3) ethylene ($C_2H_4$) 2 kg/h; and 4) nitrogen (carrier gas) 1.6 kg/h.

From a second coater positioned downstream from the first coater, a mixed gas stream containing monobutyl tin trichloride ($C_4H_9SnCl_3$ or "MBTC"), hydrofluoric acid (HF), air and steam was directed to a surface of the undercoating. The gases of the mixed gas stream included the starting materials supplied at the following rate ranges: 1) 93.5 kg/h of MBTC; 2) 1160 kg/h of air; 3) 8.4 kg/h of water; and 4) 22.5 kg/h of a water solution of 2.5 wt. % of HF.

EXAMPLE 3+

From a first coater positioned inside a float bath, a mixed gas stream containing: silane (SiH4), carbon dioxide ($CO_2$), ethylene ($C_2H_4$) and nitrogen ($N_2$—carrier gas) was directed to a heated surface of the glass ribbon. The gases of the mixed gas stream included the starting materials supplied at the following rate ranges: 1) silane ($SiH_4$) 1.2 kg/h; 2) carbon dioxide ($CO_2$) 14 kg/h; 3) ethylene ($C_2H_4$)2 kg/h; and 4) nitrogen (carrier gas) 1.6 kg/h.

From a second coater positioned downstream from the first coater, a mixed gas stream containing monobutyl tin trichloride ($C_4H_9SnCl_3$ or "MBTC"), hydrofluoric acid (HF), nitric acid ($HNO_3$), air and steam was directed to a surface of the undercoating. The gases of the mixed gas stream included the starting materials supplied at the following rate ranges: 1) 85.0 kg/h of MBTC; 2) 1160 kg/h of air; 3) 4.3 kg/h of water; 4) 22.5 kg/h of a water solution of 2.5 wt. % of HF; and 5) 10.5 kg/h of water solution of 70 wt. % of $HNO_3$.

The fluorine doped tin oxide thin films made by methods of the present invention produce thin films, which at comparable thicknesses demonstrate increased optical properties for the same infrared reflecting properties. Select optical properties are given in Table 3 below.

TABLE 3

Optical and Infrared Reflecting Properties of Example 3+ and 3 Low-E Coatings on Single Panes of 3.85 mm Thick Soda-lime Glass.

| Example | $SnO_2$ Thickness (Å) | Haze % | Normal Emissivity | Tv * % | Shading Coef ** |
|---|---|---|---|---|---|
| 3 | 4620 | 0.97 | 0.11 | 78.7 | 0.81 |
| 3+ | 4670 | 0.68 | 0.11 | 79.7 | 0.83 |

* Illuminant D65, 2° solid angle.
** According to ISO 9050 (2003) standard.

It can be seen from the table that the introduction of $HNO_3$ (Example 3+) has increased the Shading Coefficient and decreased the Haze compared to Example 3 made without $HNO_3$. Also, the luminar transmittance and the shading coefficient have been increased.

EXAMPLE 4

From a first coater positioned inside a float bath, a mixed gas stream containing titanium tetra-isopropoxide (Ti[—O—CH—$(CH_3)_2]_4$, or "TTIP") and nitrogen ($N_2$—carrier gas) was directed to a heated surface of the glass ribbon. The gases of the mixed gas stream included the starting materials supplied at the following rate ranges: 1) TTIP 1.85 kg/h and 2) nitrogen (carrier gas) 150 kg/h.

From a first coater positioned downstream the float bath and downstream the $TiO_2$ precoater, a mixed gas stream containing silane ($SiH_4$), air, ethylene ($C_2H_4$) and nitrogen ($N_2$—carrier gas) was directed to a heated surface of the glass ribbon. The gases of the mixed gas stream included the starting materials supplied at the following rate ranges: 1) silane ($SiH_4$) 0.75 kg/h; 2) air 96 kg/h; 3) ethylene ($C_2H_4$) 1.0 kg/h; and 4) nitrogen (carrier gas) 101 kg/h.

From a second coater positioned downstream from the first coater, a mixed gas stream containing monobutyl tin trichloride ($C_4H_9SnCl_3$ or "MBTC"), hydrofluoric acid (HF), nitric acid ($HNO_3$), air and steam was directed to a surface of the undercoating. The gases of the mixed gas stream included the starting materials supplied at the following rate ranges: 1) 98.6 kg/h of MBTC; 2) 970 k/h of air; 3) 9.1 kg/h of water; and 4) 25.6 kg/h of a water solution of 2.5 wt. % of HF.

EXAMPLE 4+

From a precoater positioned inside a float bath, a mixed gas stream containing titanium tetra-isopropoxide (Ti[—O—CH—$(CH_3)_2]_4$, or "TTIP") and nitrogen ($N_2$—carrier gas) was directed to a heated surface of the glass ribbon. The gases of the mixed gas stream included the starting materials supplied at the following rate ranges: 1) TTIP 1.85 kg/h and 2) nitrogen (carrier gas) 150 kg/h.

From a first coater positioned downstream the float bath and downstream the $TiO_2$ precoater, a mixed gas stream containing silane ($SiH_4$), air, ethylene ($C_2H_4$) and nitrogen ($N_2$—carrier gas) was directed to a heated surface of the glass ribbon. The gases of the mixed gas stream included the starting materials supplied at the following rate ranges: 1) silane ($SiH_4$) 0.75 kg/h; 2) ethylene ($C_2H_4$) 1.0 kg/h; and 3) nitrogen (carrier gas) 101 kg/h.

From a second coater positioned downstream from the first coater, a mixed gas stream containing monobutyl tin trichloride ($C_4H_9SnCl_3$ or "MBTC"), hydrofluoric acid (HF), nitric acid ($HNO_3$), air and steam was directed to a surface of the undercoating. The gases of the mixed gas stream included the starting materials supplied at the following rate ranges: 1) 85.0 kg/h of MBTC; 2) 970 kg/h of air; 3) 4.9 kg/h of water; 4) 25.6 kg/h of a water solution of 2.5 wt. % of HF; and 5) 14.0 kg/h of $HNO_3$.

The fluorine doped tin oxide thin films made by methods of the present invention produce thin films, which at comparable thicknesses demonstrate increased optical properties for the same infrared reflecting properties. Results of properties measurements are given in Table 4 below.

TABLE 4

Optical and Infrared Reflecting Properties of Example 4+ and 4 Low-E Coatings on Single Panes of 3.85 mm Thick Soda-lime Glass.

| Example | $SnO_2$ Thickness (Å) | Haze % | Normal Emissivity | Tv * % | Shading Coef ** |
|---|---|---|---|---|---|
| 4 | 4680 | 0.76 | 0.11 | 79.3 | 0.81 |
| 4+ | 4860 | 0.38 | 0.11 | 81.0 | 0.83 |

* Illuminant D65, 2° solid angle.
** According to ISO 9050 (2003) standard.

Again, it can be seen from the table that the introduction of $HNO_3$ (Example 4+) has increased the Shading Coefficient and decreased the Haze compared to Example 4 made without $HNO_3$. Also, the luminar transmittance and the shading coefficient have been increased.

While the present invention has been described with respect to specific embodiments, it is not confined to the specific details set forth, but includes various changes and modifications that may suggest themselves to those skilled in the art, all falling within the scope of the invention as defined by the following claims.

What is claimed is:

1. A method of making an insulating glass unit (IGU) comprising a first sheet of glass, a second sheet of glass, and a sealant assembly, the method comprising:
   a) providing a first sheet of glass and a second sheet of glass;
   b) depositing online, from a first coater positioned online, a first coating of an optical thin film coating on at least a portion of the first sheet of glass;
   c) depositing online, from a second coater positioned online, a second coating of the optical thin film coating on at least a portion of the first coating, wherein the second coating comprises fluorine doped tin oxide; and
   d) disposing a sealant assembly around the periphery of the first sheet of glass and the second sheet of glass for maintaining the first sheet and the second sheet in a spaced-apart relationship from each other;
   wherein the second coating is deposited from a gas stream comprising at least one precursor gas and an oxidizing agent at an elevated temperature;
   wherein the oxidizing agent is a solution of 10%-100% nitric acid.

2. The method of claim 1, wherein the first coating comprises silicon.

3. The method of claim 1, wherein the first coating comprises silicon in the form of an oxide, nitride or carbide or combinations thereof.

4. The method of claim 1, wherein the first coating comprises a material selected from the group consisting of silicon oxide, silicon dioxide, silicon nitride, silicon oxynitride, silicon carbide or silicon oxycarbide or combinations thereof.

5. The method of claim 1, wherein the first coating comprises silicon oxycarbide.

6. The method of claim 1, wherein the elevated temperature is a temperature in the range of 200° C. to 800° C.

7. The method of claim 1, wherein the elevated temperature is a temperature in the range of 450° C. to 750° C.

8. The method of claim 1, wherein the first coating comprises a single layer.

9. The method of claim 1, wherein the first coating comprises multiple layers.

10. A method of producing an insulating glass unit (IGU) comprising a first sheet of glass, a second sheet of glass, and a sealant assembly, the method comprising:
 a) providing a first sheet of glass and a second sheet of glass;
 b) depositing online, from a first coater positioned online, a first coating of an optical thin film coating on at least a portion of the first sheet of glass;
 c) depositing online, from a second coater positioned online, a second coating of the optical thin film coating on at least a portion of the first coating, wherein the second coating comprises fluorine doped tin oxide, wherein the second coating is deposited from a gas stream comprising at least one precursor gas and an oxidizing agent at an elevated temperature; and
 d) disposing a sealant assembly around the periphery of the first sheet of glass and the second sheet of glass for maintaining the first sheet and the second sheet in a spaced-apart relationship from each other;
 wherein the oxidizing agent is a solution of 10%-100% nitric acid; and
 wherein the second coating has an emissivity value that is at least about 0.04 lower than the emissivity value of a second coating deposited in the absence of nitric acid.

11. The method of claim 10, wherein the first coating comprises silicon.

12. The method of claim 10, wherein the first coating comprises silicon in the form of an oxide, nitride or carbide or combinations thereof.

13. The method of claim 10, wherein the first coating comprises a material selected from the group consisting of silicon oxide, silicon dioxide, silicon nitride, silicon oxynitride, silicon carbide or silicon oxycarbide or combinations thereof.

14. The method of claim 10, wherein the first coating comprises silicon oxycarbide.

15. The method of claim 10, wherein the elevated temperature is a temperature in the range of 200° C. to 800° C.

16. The method of claim 10, wherein the elevated temperature is a temperature in the range of 450° C. to 750° C.

17. The method of claim 10, wherein the first coating comprises a single layer.

18. The method of claim 10, wherein the first coating comprises multiple layers.

19. The method of claim 1,
 wherein the second coating has a thickness that is at least about 20% greater than the thickness of a second coating deposited in the absence of nitric acid.

20. The method of claim 1,
 wherein the second coating has a solar shading coefficient at least about 0.01 percent higher than the solar shading coefficient of a second coating of about the same thickness deposited in the absence of nitric acid.

21. The method of claim 1, further comprising
 depositing online, from a first precoater positioned online, a precoating on at least a portion of the first sheet of glass;
 wherein the first coating is also deposited on at least a portion of the precoating; and further
 wherein the second coating has an optical transmission rate at least about 0.9 percent higher than the optical transmission rate of a second coating of about the same thickness deposited in the absence of nitric acid.

22. The method of claim 1,
 wherein the second coating has a haze at least about 0.25 percent lower than the haze of a second coating of about the same thickness deposited in the absence of nitric acid.

23. The method of claim 1, further comprising
 depositing online, from a first precoater positioned online, a precoating on at least a portion of the first sheet of glass;
 wherein the first coating is also deposited on at least a portion of the precoating; and further
 wherein the second coating has a haze at least about 0.25 percent lower than the haze of a second coating of about the same thickness deposited in the absence of nitric acid.

24. The method of claim 21, wherein the precoating comprises a material selected from the group consisting of titanium oxide, titanium nitride, titanium carbide or oxycarbide or combinations thereof.

25. The method of claim 23, wherein the precoating comprises a material selected from the group consisting of titanium oxide, titanium nitride, titanium carbide or oxycarbide or combinations thereof.

26. The method of claim 21, wherein the precoating comprises titanium dioxide.

27. The method of claim 23, wherein the precoating comprises titanium dioxide.

* * * * *